United States Patent
Liu

(10) Patent No.: US 8,857,925 B2
(45) Date of Patent: Oct. 14, 2014

(54) MOUNTING BRACKET FOR POWER SUPPLY UNIT

(71) Applicant: Lei Liu, Shenzhen (CN)

(72) Inventor: Lei Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 14 days.

(21) Appl. No.: 13/678,553

(22) Filed: Nov. 16, 2012

(65) Prior Publication Data

US 2014/0015386 A1    Jan. 16, 2014

(30) Foreign Application Priority Data

Jul. 11, 2012    (CN) .......................... 2012 1 02386939

(51) Int. Cl.
    *H05K 5/04*    (2006.01)
(52) U.S. Cl.
    CPC ........................................ *H05K 5/04* (2013.01)
    USPC ........................................ 312/223.2; 312/329
(58) Field of Classification Search
    USPC ............... 312/329, 326, 109, 223.2; 220/525, 220/523, 3.8, 3.94, 3.7, 826, 810
    See application file for complete search history.

(56) References Cited

U.S. PATENT DOCUMENTS

| | | | | |
|---|---|---|---|---|
| 1,275,695 A | * | 8/1918 | Iverson | 220/525 |
| 4,301,942 A | * | 11/1981 | Kupperman et al. | 220/592.17 |
| 4,720,021 A | * | 1/1988 | Byrns | 220/764 |
| 6,168,059 B1 | * | 1/2001 | Salenbauch et al. | 224/539 |
| 7,105,745 B2 | * | 9/2006 | Drane et al. | 174/67 |
| 8,381,351 B2 | * | 2/2013 | Miller et al. | 15/264 |
| 2008/0190951 A1 | * | 8/2008 | Gallagher et al. | 220/826 |
| 2010/0039769 A1 | * | 2/2010 | Saisila | 361/679.58 |
| 2013/0334241 A1 | * | 12/2013 | Abdi et al. | 220/826 |

* cited by examiner

*Primary Examiner* — Daniel Rohrhoff
(74) *Attorney, Agent, or Firm* — Novak Druce Connolly Bove + Quigg LLP

(57) ABSTRACT

A mounting bracket includes a metal chassis and a metal cover. The metal chassis includes two opposite side plates, a top plate, a bottom plate, and a middle plate connected between middles of the top plate and the bottom plate, parallel to the side plates. Two receiving spaces are divided in the metal chassis by the middle plate, for receiving two power supply units. A first end of the metal cover is pivotably connected to a middle of a front end of the metal chassis. When the metal cover is rotated towards one of the receiving spaces, the metal cover covers the front end of the one of the receiving spaces, for shielding radiation and preventing air turbulence.

2 Claims, 4 Drawing Sheets

MOUNTING BRACKET FOR POWER SUPPLY UNIT

BACKGROUND

1. Technical Field

The present disclosure relates to a bracket for mounting a power supply unit.

2. Description of Related Art

Typically, two power supply units are mounted in a bracket of a server to ensure the server operates steadily. Sometimes, only one power supply unit is mounted in the bracket, thereby a part of the bracket is vacant, which will lead to an increased air turbulence and radiation.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one."

Figure 1:
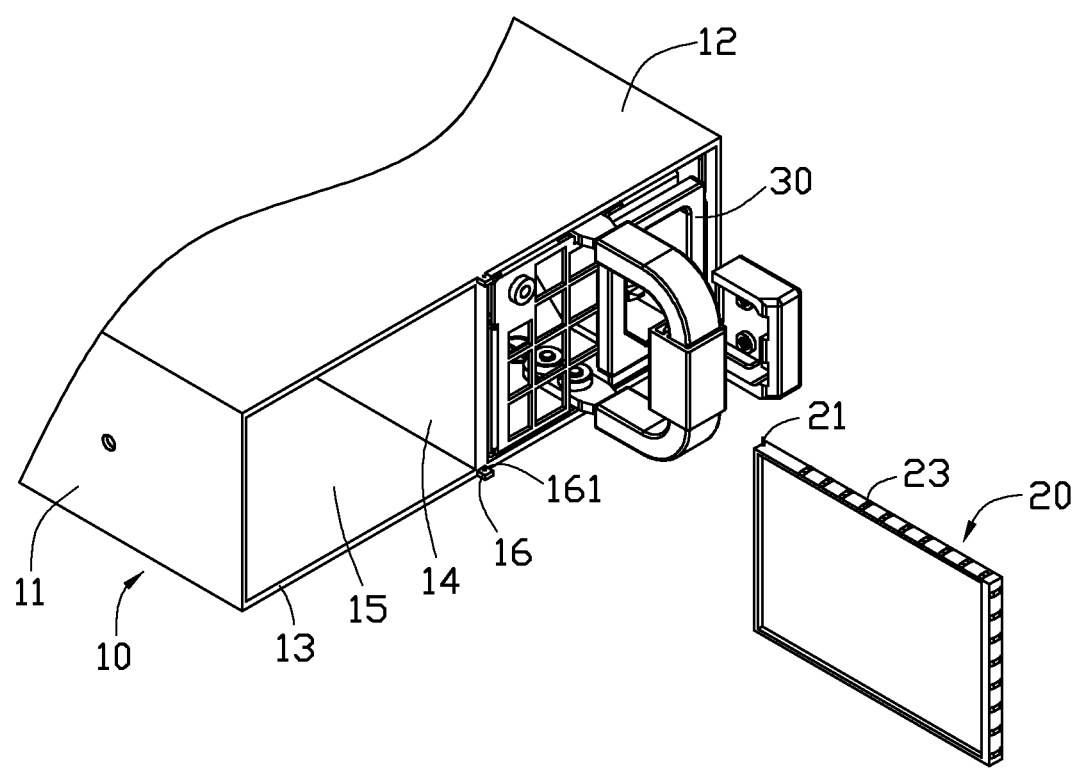
FIG. 1 is a partial, exploded, isometric view of an exemplary embodiment of a mounting bracket together with a power supply unit, wherein the mounting bracket includes a cover.
Figure 4:
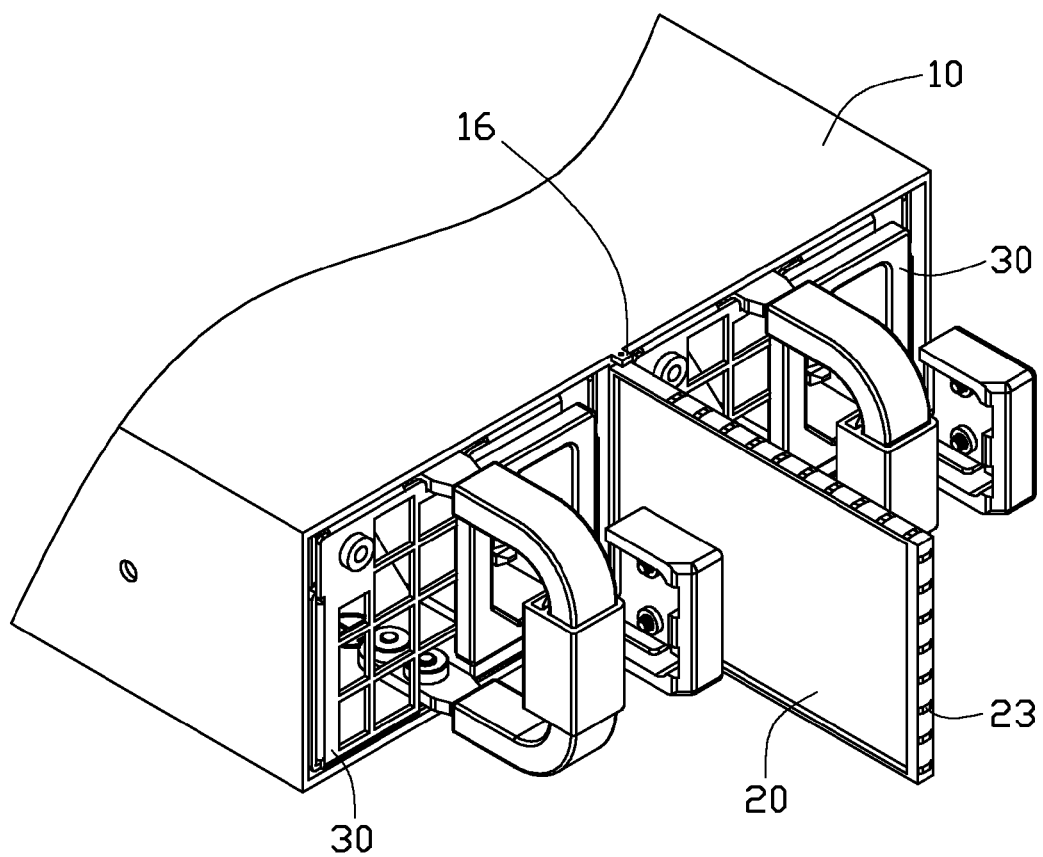
FIG. 4 is an assembled, isometric view of the mounting bracket of FIG. 1 together with two power supply units.

FIGS. 1 and 4 show an embodiment of a mounting bracket for one or two power supply units 30. The mounting bracket includes a metal chassis 10 and a rectangular metal cover 20.

The metal chassis 10 includes two opposite side plates 11, a top plate 12 connected between the tops of the side plates 11 in a perpendicular manner, a bottom plate 13 connected between the bottoms of the side plates 11 in a perpendicular manner, and a middle plate 14 connected between the middles of the top plate 12 and the bottom plate 13 in a perpendicular manner, parallel to the side plates 11. Two receiving spaces 15 are divided in the metal chassis 10 by the middle plate 14. The two power supply units 30 can be respectively received in the receiving spaces 15. A block 16 protrudes from the middle of the front end of each of the top and bottom plates 12 and 13. A pivot hole 161 is defined in each block 16.

A pivot 21 protrudes from a first end of each of the top and the bottom of the metal cover 20. A plurality of bridge-shaped resilient tabs 23 is widthwise formed on the top, the bottom, and a second end of the metal cover 20 away from the first end. Opposite ends of each resilient tab 23 respectively adjoin opposite sides of the metal cover 20.

Figure 2:
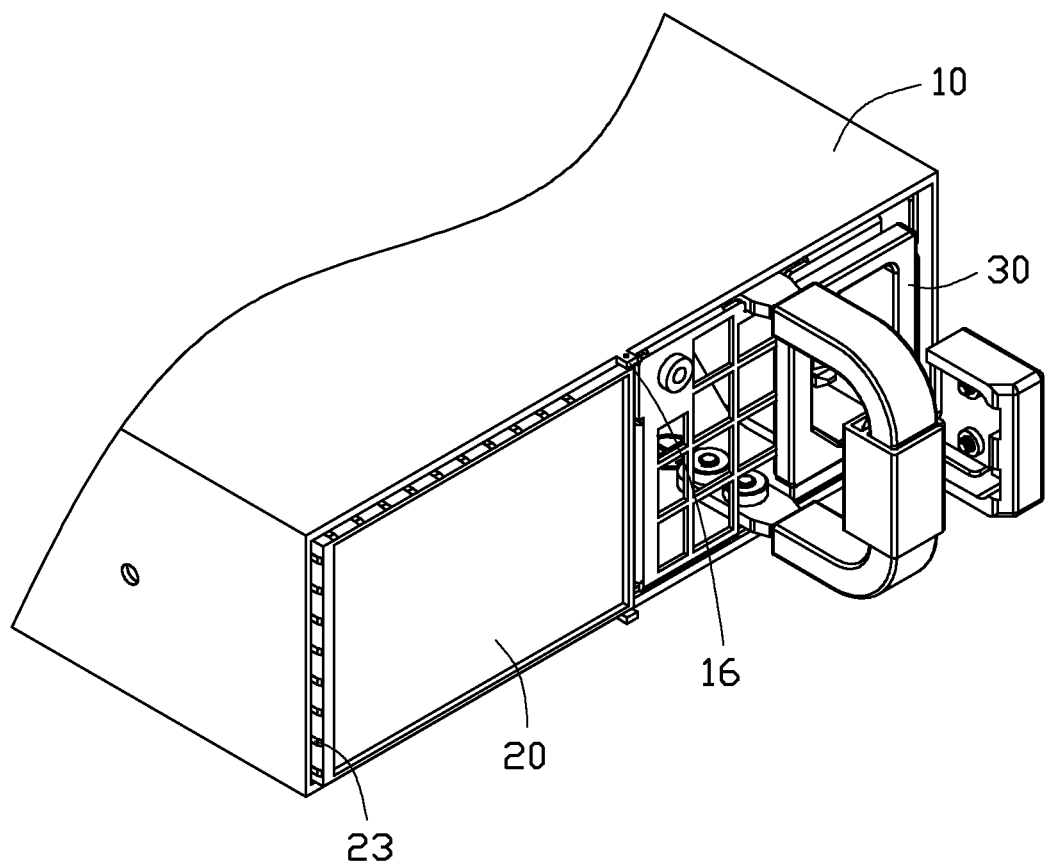
FIG. 2 is an assembled, isometric view of FIG. 1.
Figure 3:
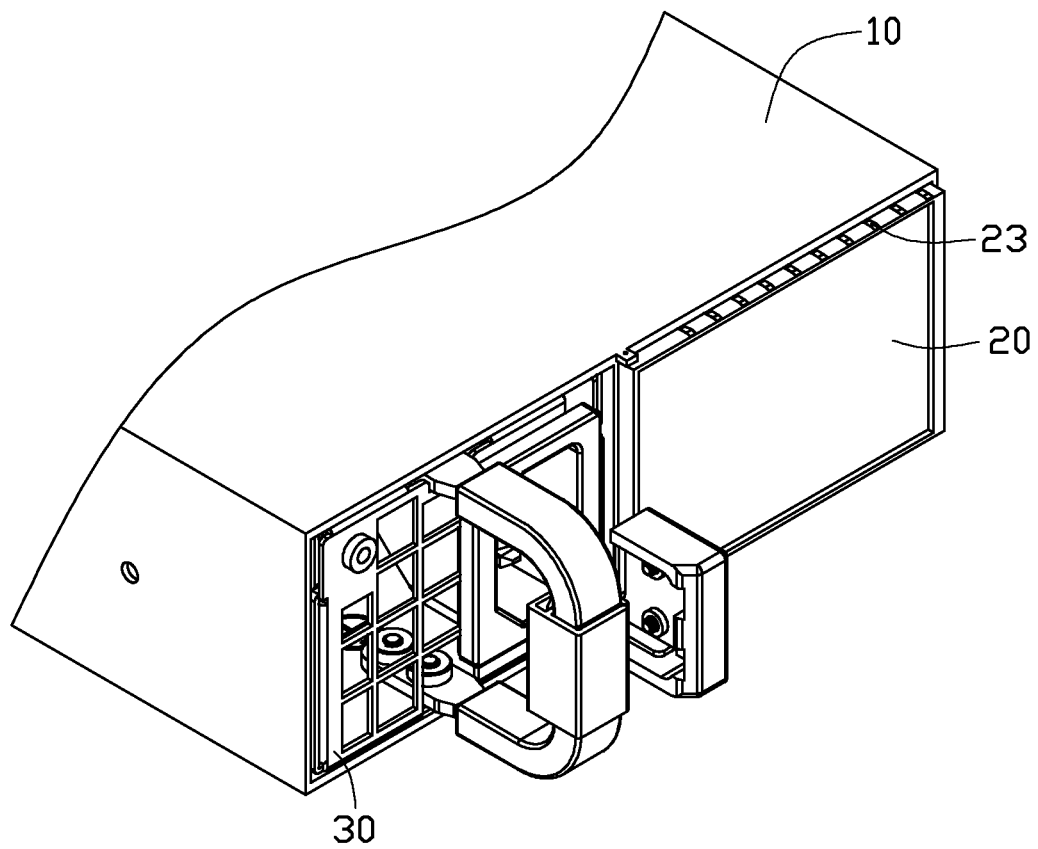
FIG. 3 is similar to FIG. 2, but showing the power supply unit and the cover in another state.

FIGS. 2 and 3 show that in assembly, the blocks 16 are deformed away from each other, to allow the pivots 21 to align with the pivot holes 161. The blocks 16 are released and restored, the pivots 21 pivotably engage in the pivot holes 161. Thereby, the first end of the metal cover 20 is pivotably connected to the middle of the front end of the metal chassis 10.

If only one power supply unit 30 is required to be mounted, the power supply unit 30 is inserted into one of the receiving spaces 15. The metal cover 20 is rotated toward the other receiving space 15, until the resilient tabs 23 on the top, the bottom, and the second end of the metal cover 20 abut the front ends of inner surfaces of the top plate 12, the bottom plate 13, and a corresponding one of the side plates 11 bounding the other receiving space 15. Thereby, the metal cover 20 covers the front end of the other receiving space 15, which can shield radiation and prevent air turbulence. Middle portions of the resilient tabs 23 are pressed by the metal chassis 10 and deformed, to tightly secure the metal cover 20 to the front end of the other receiving space 15, and further shield radiation.

FIG. 4 shows the two power supply units 30 being mounted in the mounting bracket. The cover 20 is rotated to a same plane with the middle plate 14. The power supply units 30 are respectively inserted into the receiving spaces 15.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A mounting bracket, comprising:
a metal chassis comprising two opposite side plates, a top plate connected between tops of the side plates, a bottom plate connected between bottoms of the side plates, and a middle plate connected between middles of the top plate and the bottom plate and parallel to the side plates, two receiving spaces are formed in the metal chassis and divided by the middle plate, for receiving two power supply units; and
a metal cover, a first end of the metal cover pivotably connected to a middle of a front end of the metal chassis, and a plurality of resilient tabs formed on a top, a bottom, and a second end of the metal cover away from the first end, wherein when the metal cover is rotated towards one of the receiving spaces, the resilient tabs on the top, the bottom, and the second end of the metal cover respectively abut the top plate, the bottom plate, and a corresponding one of the side plates bounding said one of the receiving spaces, the metal cover covers a front end of said one of the receiving spaces;
each resilient tab is bridge-shaped, and opposite ends of each resilient tab respectively adjoin opposite sides of the metal cover.

2. The mounting bracket of claim 1, wherein a block protrudes from a middle of a front end of each of the top and bottom plates, a pivot hole is defined in each block, a pivot protrudes from a first end of each of the top and the bottom of the metal cover, for pivotably engaging in a corresponding pivot hole.

* * * * *